(12) United States Patent
Nam et al.

(10) Patent No.: US 6,380,579 B1
(45) Date of Patent: Apr. 30, 2002

(54) CAPACITOR OF SEMICONDUCTOR DEVICE

(75) Inventors: Sang-don Nam, Yongin; Jin-won Kim, Seoul, both of (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 09/547,940

(22) Filed: Apr. 11, 2000

(30) Foreign Application Priority Data

Apr. 12, 1999 (KR) .............................. 99-12769

(51) Int. Cl.[7] .............................. H01L 27/108
(52) U.S. Cl. ............ 257/306; 257/295; 257/296; 257/297; 257/303; 257/306; 257/307; 257/308; 257/309; 257/310; 257/757; 257/767; 438/244; 438/253; 438/393; 438/394; 438/395; 438/396; 438/250; 361/15
(58) Field of Search .............. 257/303, 306–310, 257/757, 767, 295–297; 438/253, 244, 393–396, 532; 361/15

(56) References Cited

U.S. PATENT DOCUMENTS 5,798,903 A * 8/1998 Dhote et al. .............. 361/321.4
5,879,985 A * 3/1999 Gambino et al. ........... 438/253
6,174,769 B1 * 1/2001 Lou .......................... 438/253

FOREIGN PATENT DOCUMENTS

| JP | 6077430 | 3/1994 |
| JP | 9283719 | 10/1997 |
| KR | 0012257 | 9/1994 |
| KR | 98-6335 | 3/1998 |

* cited by examiner

Primary Examiner—Tom Thomas
Assistant Examiner—Donghee Kang
(74) Attorney, Agent, or Firm—Lee & Sterba, P.C.

(57) ABSTRACT

A capacitor of a semiconductor device which uses a high dielectric layer and a method of manufacturing the same are provided. The capacitor includes a storage electrode having at least two conductive patterns which overlap each other and a thermally-stable material layer pattern being positioned between the conductive layer patterns. The storage electrode and the thermally-stable material layer pattern are formed by alternately forming a conductive layer and a thermally-stable material layer, and patterning the conductive layer and the thermally-stable material layer to have predetermined shapes. With the present structure, it is possible to prevent the storage electrode from being transformed or broken during a thermal treatment process for forming a high dielectric layer on the storage electrode or in a subsequent high temperature thermal treatment process.

11 Claims, 9 Drawing Sheets

CAPACITOR OF SEMICONDUCTOR DEVICE

BACKGROUND OF THE INVENTION

1. Field of the Invention

The present invention relates to a semiconductor device and a method for manufacturing the same, and more particularly, to a capacitor of a semiconductor device and a method for manufacturing the same.

2. Description of the Related Art

Semiconductor devices include unit cells. A unit cell of a DRAM device consists of a cell capacitor and an access transistor. The cell capacitor directly affects the characteristics of the DRAM device. As the cell capacitance increases, a soft error rate (SER) is reduced and a low voltage operation characteristic is improved. However, as the circuit integration density of the DRAM device increases, the area occupied by the unit cell is reduced. Accordingly, in order to improve the reliability and the electrical characteristics of a highly integrated DRAM device, a cell capacitor having a capacitance larger than a certain value must be fabricated within the restricted area size of the DRAM device.

Recently, in order to increase the cell capacitance, a material layer having a high dielectric constant, such as a tantalum oxide ($Ta_2O_5$) layer, an aluminum oxide ($Al_2O_3$) layer, a barium, strontium and titanium (BST) layer ((Ba, Sr)$TiO_3$), a lead, zirconium, and titanium (PZT) layer ((Pb, Zr)$TiO_3$), or a lead, lanthanum, zirconium, and titanium (PLZT) layer ((Pb,La,Zr)$TiO_3$), was adopted as a dielectric layer interposed between a storage electrode and a plate electrode in order to increase the cell capacitance. However, a high dielectric layer such as either the $Ta_2O_5$ layer, the BST layer, the PZT layer, or the PLZT layer must be deposited by a sputtering process, an atomic layer deposition (ALD) process, or a chemical vapor deposition (CVD) process and thermally treated at a temperature of about 550° C. to 750° C. When the storage electrode is formed of a polysilicon layer, the storage electrode is oxidized. Accordingly, the thickness of the dielectric layer increases or an intersurface characteristic between the dielectric layer and the storage electrode deteriorates, thus deteriorating the leakage current characteristic of the dielectric layer. Therefore, the storage electrode of a capacitor employing the high dielectric layer having the high dielectric constant must be formed from an oxidation-resistant metal layer or a metal oxide layer having excellent conductivity. A platinum (Pt) layer is widely used as the oxidation-resistant metal layer. A ruthenium oxide ($RuO_2$) layer is widely used as the metal oxide layer having excellent conductivity. The storage electrode is preferably manufactured to have a three-dimensional shape, for example, the storage electrode may be cylindrical in order to increase the capacitance of the capacitor formed within the size restricted cell area.

Figure 1:
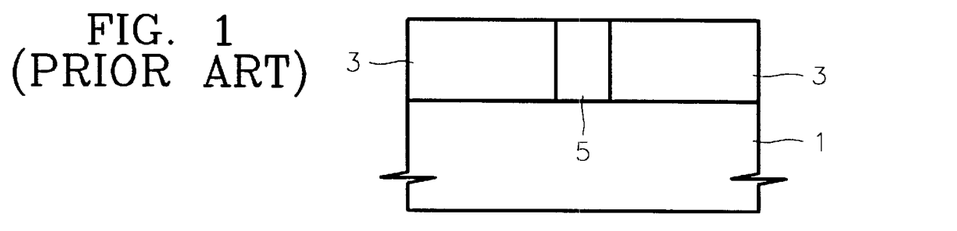
FIGS. 1–3 are cross-sectional views illustrating a method for manufacturing a conventional capacitor.
Figure 2:
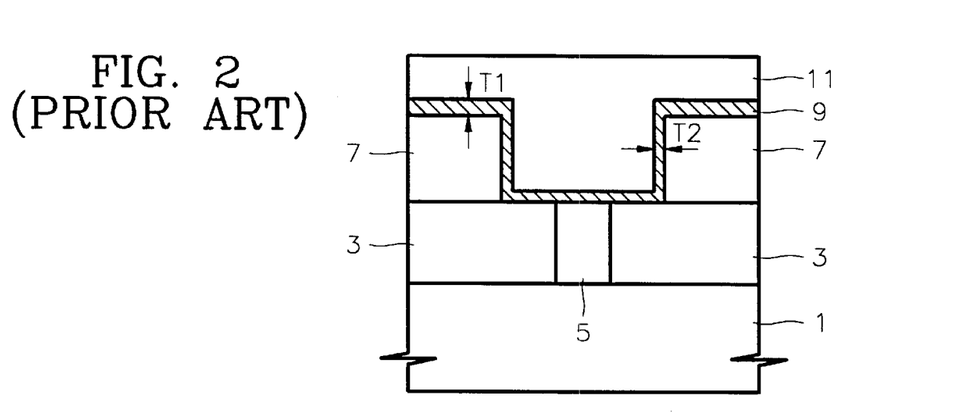
Figure 3:
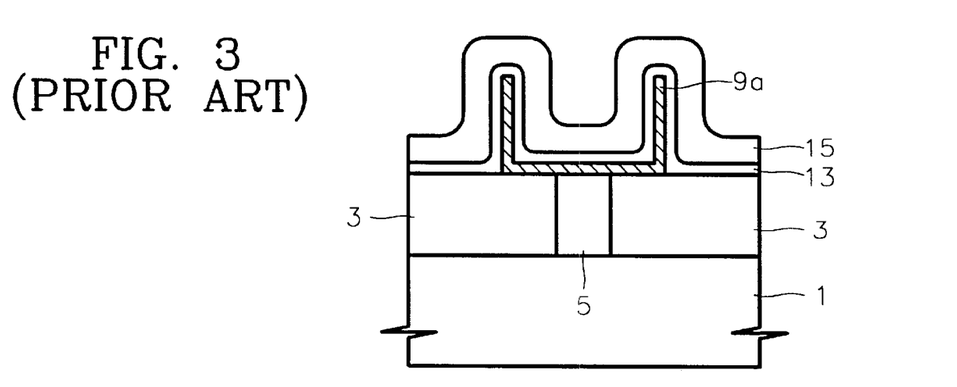

FIGS. 1 through 3 are sectional views describing a method for manufacturing a conventional cylindrical capacitor. As shown in FIG. 1, an interlayer dielectric layer is formed on a semiconductor substrate 1. An interlayer dielectric layer pattern 3, including a storage node contact hole which exposes a predetermined region of the semiconductor substrate 1, is formed by patterning the interlayer dielectric layer. A contact plug 5, which contacts the semiconductor substrate 1, is formed from a conductive material such as tungsten (W) and is placed in the storage node contact hole.

Referring to FIG. 2, a sacrificial insulating layer 7 is formed on the entire surface of the semiconductor substrate. The sacrificial insulating layer pattern 7 includes a hole exposing the contact plug 5. A conductive layer 9 is formed over the entire surface of the semiconductor substrate over the sacrificial insulating layer pattern 7. The conductive layer 9 is made from an oxidation-resistant metal layer, such as a platinum (Pt) layer, or a conductive metal oxide layer, such as a ruthenium oxide ($RuO_2$) layer.

Currently, the oxidation-resistant metal layer and the conductive metal oxide layer are difficult to form using a chemical vapor deposition (CVD) method. Accordingly, the conductive layer 9 is generally formed by a well-known sputtering method. However, the sputtering process show problems associated with poor step coverage. As a result, the thickness T2 of the conductive layer 9 as formed on the side wall of the sacrificial insulating layer pattern 7, is less than the thickness of TI, where the conductive layer 9 is formed on an upper surface of the sacrificial insulating layer pattern 7. Efforts to increase the thickness of T2 using the sputtering method renders the thickness T1 to become very thick. Since the cost of the material layer used for the conductive layer 9 is high, the manufacturing cost of the semiconductor device increases with the use of thicker material layers. Therefore, it is difficult and expensive to increase the thickness of the conductive layer 9 formed on the side wall of the sacrificial insulating layer pattern 7 using traditional sputtering methods. Also, shown in FIG. 2 is an insulating layer 11 for planarization. The insulating layer 11 for planarization fills a concave region on the contact plug 5. The insulating layer 11 for planarization may be a CVD oxide layer which is formed over the entire surface of the semiconductor substrate over the conductive layer 9.

Referring to FIG. 3, the insulating layer 11 for planarization is etched by a blanket etch-back process or a chemical mechanical polishing (CMP) process until the conductive layer 9, formed over the entire surface of the semiconductor substrate over the sacrificial insulating layer pattern 7, is exposed. After a sputter etching process, a cylindrical storage electrode 9a is formed, remaining only on the side wall and the bottom of the hole exposing the contact plug 5. The inner surface and the outer surface of the vertical pillar for the cylindrical storage electrode 9a are also exposed by removing the insulating layer 11 for planarization remaining inside the storage electrode 9a and the sacrificial insulating layer pattern 7. A high dielectric layer 13 and a plate electrode 15 are sequentially formed over the entire surface of the semiconductor substrate, including the inner surface and the outer surface of the vertical pillar for the cylindrical storage electrode 9a. When the high dielectric layer 13 is formed from either a $Ta_2O_5$ layer, a BST layer, a PZT layer, or a PLZT layer, the high dielectric layer 13 must be thermally treated at a temperature of between about 550° C. to 750° C. to achieve crystallization. During the heat treatment, the grain of the cylindrical storage electrode 9a is grown, so that the cylindrical storage electrode 9a may be easily physically transformed. Such a phenomenon becomes severe as the thickness T2 of the pillar of the cylindrical storage electrode 9a is reduced. As a result, cracks may form in the high dielectric layer 13 due to the physical transformation of the cylindrical storage electrode 9a.

Accordingly, the cracks which are generated in the high dielectric film degrades the leakage current characteristic of the capacitor and reduces the capacitance. Furthermore, when a pre-treatment process such as a process of cleaning the surface of the cylindrical storage electrode is carried out before forming the high dielectric film, the very thin vertical pillar of the cylindrical storage electrode may be easily broken.

SUMMARY OF THE INVENTION

A feature of the present invention is to provide a capacitor having a storage electrode formed from a metal layer or a conductive material layer containing a metal that is resistant to transformation and breakage.

Another feature of the present invention is to provide a method for manufacturing a capacitor, as associated with the first feature of the present invention.

To achieve the first feature of the present invention, there is provided a capacitor comprising a storage electrode having at least two conductive layer patterns. The two conductive layer patterns overlap each other on a semiconductor substrate, and a thermally-stable material layer pattern is positioned between the conductive layer patterns. The conductive layer pattern may consist of a horizontal bottom and a pillar which protrudes upwardly from a predetermined location on the horizontal bottom. Preferably, each conductive layer pattern has a cylindrical shape.

Also, the thermally-stable material layer pattern may be positioned in the entire region between the conductive layer patterns, or may be positioned in the predetermined region between the conductive layer patterns, preferably, only in the region between the pillars of the conductive layer patterns. When the thermally-stable material layer pattern is positioned in the entire region between the conductive layer patterns, the thermally-stable material layer pattern is preferably a conductive layer, that is, a thermally-stable conductive layer. This is because it is possible to maximize the surface area of the storage electrode when the conductive layer patterns, constituting the storage electrode, are electrically connected to each other. However, when the thermally-stable material layer pattern is positioned only between the pillars of the conductive layer patterns and the bottoms of the conductive layer patterns contact each other, the thermally-stable material layer pattern can be formed from a thermally-stable insulating layer or a thermally-stable conductive layer.

When the thermally-stable conductive layer is positioned between the pillars of the conductive layer patterns and the magnitude of the work function of the thermally-stable conductive layer is smaller than that of the intended usage for the conductive layer pattern, the surface height of the thermally-stable conductive layer is preferably lower than the upper surfaces of the pillars. That is, when the required electrical barrier height of the thermally-stable conductive layer is lower than the electrical barrier height of the conductive layer patterns, which form the storage electrode, recessed grooves are preferably formed between the pillars. As a result, the high dielectric layer on the thermally-stable conductive layer is thicker than the high dielectric layer formed on the conductive layer patterns. Accordingly, it is possible to improve a leakage current characteristic between a subsequent plate electrode and the thermally-stable conductive layers, because of the thickness of the high dielectric layer formed on the thermally-stable conductive layer.

Furthermore, the upper portions of the respective pillars may be in contact each other when the thermally-stable material layer pattern is only positioned between the pillars of the respective conductive layer patterns. Accordingly, the thermally-stable material layer pattern is completely surrounded by the respective conductive layer patterns.

The conductive layer pattern is formed from an oxidation-resistant metal layer, such as, either a platinum (Pt) layer, an iridium (Ir) layer, a ruthenium (Ru) layer, or an osmium (Os) layer, or a conductive metal oxide layer such as a ruthenium oxide ($RuO_2$) layer or an iridium oxide ($IrO_2$) layer.

The thermally-stable conductive layer is preferably either a refractory metal layer, a binary refractory metal nitride layer, a ternary refractory metal nitride layer, a refractory metal silicide layer, a conductive carbide layer, or a conductive boride layer. Specifically, the refractory metal layer is preferably a tungsten (W) layer, a titanium (Ti) layer or a tantalum (Ta) layer. The binary refractory metal nitride layer is preferably a TiN layer, a TaN layer, or a WN layer. Also, the ternary refractory metal nitride layer is preferably a WSiN layer, a TiAlN layer, a TiSiN layer, or a TaSiN layer. The refractory metal silicide layer is preferably a $TiSi_2$ layer, a $TaSi_2$ layer, or a $WSi_2$ layer. Also, the conductive carbide layer is preferably a TaC layer, a TiC layer, or a WC layer. The conductive boride layer is preferably a $TiB_2$. The thermally-stable insulating layer is formed from a dielectric layer such as an $SiO_2$ layer, an SiON layer, an $Si_3N_4$ layer, an $Al_2O_3$ layer, or a $Ta_2O_5$, or a dielectric layer having a perovskite structure such as a BST layer, a PZT layer, or a PLZT layer.

To achieve the second feature of the present invention, the method for forming the capacitor comprises the steps of forming a storage electrode having at least two conductive layer patterns which overlap each other on a semiconductor substrate and positioning a thermally-stable material layer between the at least two conductive layer patterns, and sequentially forming a high dielectric layer and a plate electrode on the storage electrode.

The storage electrode and the thermally-stable material layer may be formed by various methods. According to one of the various methods, a sacrificial insulating layer pattern, including a hole which exposes a predetermined region of a semiconductor substrate, is formed on the semiconductor substrate. A conforming conductive layer and a conforming thermally-stable material layer are alternately formed on the resultant pattern. A first material layer and a final material layer must be the conductive layers. Here, the thermally-stable material layer is preferably a material layer having conductivity.

A material layer for planarization by filling a concave region generated by the hole is formed on the final conductive layer. At least two cylindrical conductive layer patterns which overlap each other and thermally-stable material layer patterns positioned between the cylindrical conductive layer patterns are formed inside the hole by performing a sequential blanket etching on the material layer for planarization, the conductive layers, and the thermally-stable material layers, or by sequentially etching the material layer for planarization, the conductive layers, and the thermally-stable material layers using a chemical mechanical polishing (CMP) process, until the sacrificial insulating layer pattern is exposed. The material layer for planarization which resides inside the hole and the sacrificial insulating layer pattern are also removed. As a result, the at least two cylindrical conductive layer patterns form a storage electrode.

A high dielectric layer and a plate electrode are sequentially formed on the entire surface of the resultant structure from which the sacrificial insulating layer pattern was removed. A further step of forming recessed grooves between the cylindrical conductive layer patterns is done by selectively etching the thermally-stable material layer pattern being positioned between the cylindrical conductive layer patterns. At this time, the high dielectric layer must be formed so as to completely fill the grooves.

Furthermore, according to another method of forming the storage electrode and the thermally-stable material layer pattern, a sacrificial insulating layer pattern, including a hole which exposes a predetermined region of a semiconductor substrate, is formed on the semiconductor substrate. A first conforming conductive layer is formed on the sacrificial insulating layer pattern. A thermally-stable material layer is formed over the entire surface of the first conductive layer. A spacer is formed on the side wall of the first conductive material layer by anisotropic-etching the thermally-stable material layer. A second conductive layer is formed over the entire surface, including the area in which the spacer is formed. The first and second conductive layers are preferably formed from the same material layer.

A material layer for planarization fills a concave region generated by the hole that is formed on the second conductive layer. The first and second cylindrical conductive patterns, which overlap each other, are formed inside the hole by performing a sequential blanket etching on the material layer for planarization, the second conductive layer, and the first conductive layer, or by sequentially etching the material layer for planarization, the second conductive layer, and the first conductive layer using a CMP process until the sacrificial insulating layer pattern is exposed. The horizontal bottom of the first cylindrical conductive layer pattern is in contact with the horizontal bottom of the second cylindrical conductive layer pattern, thus being electrically connected to the horizontal bottom of the second cylindrical conductive layer pattern. Therefore, the spacer can be formed of a thermally-stable insulating layer as well as a thermally-stable conductive layer. The material layer for planarization that resides inside the hole and the sacrificial insulating layer pattern are removed, thereby creating first and second cylindrical conductive layer patterns to form a storage electrode.

A high dielectric layer and a plate electrode are sequentially formed over the entire surface of the resulting structure. Here, when the spacer is formed of a thermally-stable conductive layer, a step of forming the recessed grooves between the first and second cylindrical conductive layer pattern is done, by selectively etching the spacer exposed between the first and second cylindrical conductive layer patterns. The high dielectric layer must be formed so as to completely fill the grooves. Also, when the thermally-stable material layer is anisotropic etched, the upper sidewall of the first conductive layer may be exposed by excessively etching the thermally-stable material layer. The upper portion of the pillar of the first cylindrical conductive layer pattern makes contact with the upper portion of the pillar of the second cylindrical conductive pattern. Accordingly, the spacer is completely surrounded by the first and second cylindrical conductive layer patterns.

According to the present invention, a thermally-stable material layer is positioned between at least two conductive layer patterns which form the storage electrode. Therefore, it is possible to prevent the storage electrode from being transformed when a high temperature thermal treatment process is carried out to form the high dielectric layer on the storage electrode or when a subsequent thermal treatment process is performed. Accordingly, it is possible to improve the leakage current characteristic and the reliability of the capacitor since it is possible to prevent the high dielectric layer from being damaged, for example, by cracking.

The above features and advantages of the present invention will become more apparent by referring to the detailed description as set forth in the preferred embodiments of the present invention, with reference to the attached drawings.

DESCRIPTION OF THE PREFERRED EMBODIMENTS

Applicant' Korean Patent Application No. 99-12769, filed Apr. 12, 1999 is incorporated herein by reference as if fully set forth herein.

Hereinafter, the preferred embodiments of the present invention will be described in detail with reference to the attached drawings. In particular, the present invention will be described with reference to a capacitor having a cylindrical storage electrode. Also, in the respective drawings, the members having the same reference numerals are the same members. Therefore, description of the member having the same reference numeral as that of the member which was previously described will be omitted or simplified.

The structure of the capacitor according to the present invention will now be described.

Figure 4:
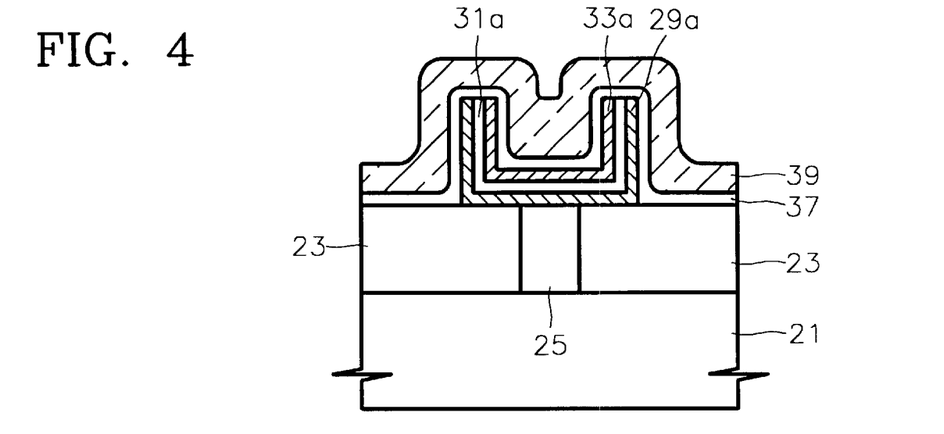
FIG. 4 is a cross-sectional view of a capacitor in accordance with an embodiment of the present invention.

Referring to FIG. 4, first and second cylindrical conductive layer patterns 29a and 33a, overlap each other and are positioned on a semiconductor substrate 21. A thermally-stable material layer pattern 31 a is positioned between the first and second cylindrical conductive layer patterns 29a and 33a. The first and second cylindrical conductive layer patterns 29a and 33a are formed from a conductive layer which does not react to a material layer having a high dielectric constant, such as a $Ta_2O_5$ and BST layer, during a thermal treatment at a temperature higher than 550° C. Such a conductive layer may be an oxidation-resistant metal layer such as a platinum (Pt) layer, an iridium (Ir) layer, a ruthenium (Ru) layer, or an osmium (Os) layer, or a conductive metal oxide layer such as a $RuO_2$ layer or an $IrO_2$ layer. The first cylindrical conductive layer pattern 29a corresponds to an outer cylinder which surrounds the second cylindrical conductive layer pattern 33a. The second cylindrical conductive layer pattern 33a corresponds to an inner cylinder surrounded by the first cylindrical conductive layer pattern 29a. The two cylindrical conductive layer patterns, that is, the first and second cylindrical conductive layer patterns 29a and 33a, form a storage electrode.

A contact plug 25 formed of a conductive layer, such as a Tungsten (W) layer, is positioned between the horizontal bottom of the first cylindrical conductive layer pattern 29a, i.e., the outer cylinder, and the semiconductor substrate 21, thereby electrically connecting the first cylindrical conductive layer pattern 29a to the semiconductor substrate 21. The contact plug 25 is surrounded by an interlayer dielectric film pattern 23. A high dielectric layer 37 and a plate electrode 39 are sequentially stacked on the surface of the storage electrode. The high dielectric layer 37 is formed of a dielectric layer such as a $Ta_2O_5$ layer or an $Al_2O_3$ layer, or a dielectric layer having a perovskite structure such as a BST layer, a PZT layer, or a PLZT layer. Also, the plate electrode is formed of a material layer that is the same as the first and second cylindrical conductive layer patterns 29a and 33a.

The thermally-stable, conductive material layer pattern 31a is formed in order to electrically connect the first cylindrical conductive layer pattern 29a to the second cylindrical conductive layer pattern 33a. The thermally-stable conductive layer is preferably either a refractory metal layer, a binary refractory metal nitride layer, a ternary refractory metal nitride layer, a refractory metal silicide layer, a conductive carbide layer, or a conductive boride layer. To be more specific, the refractory metal layer is preferably a tungsten (W) layer, a titanium (Ti) layer or a tantalum (Ta) layer. The binary refractory metal nitride layer is preferably a TiN layer, a TaN layer, or a WN layer. The ternary refractory metal nitride layer is preferably a TiSiN layer, a TaSiN layer, a WSiN layer, or a TiAlN layer. The refractory metal silicide layer is preferably a $TiSi_2$ layer, a $TaSi_2$ layer, or a $WSi_2$ layer. The conductive carbide layer is preferably either a TaC layer, a TiC layer, or a WC layer, and the conductive boride layer is preferably a $TiB_2$ layer.

As mentioned above, when the thermally-stable material layer pattern 31a is positioned between the two cylindrical conductive layer patterns 29a and 33a, which form the storage electrode, it is possible to prevent the pillars of the first and second cylindrical conductive layer patterns 29a and 33a from being transformed or broken during a subsequent thermal treatment process for crystallizing the high dielectric layer 37. Accordingly, it is possible to realize a high performance capacitor since it is possible to prevent the high dielectric layer, which contacts the storage electrode, from cracking.

Figure 5:
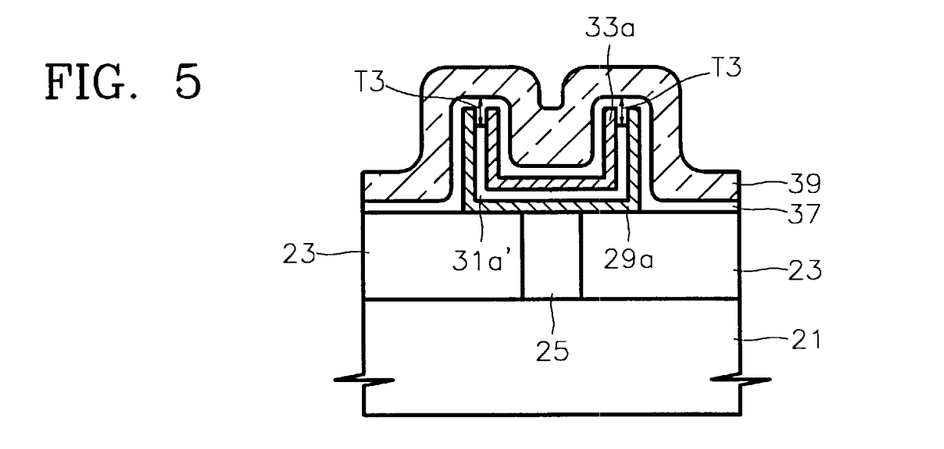
FIG. 5 is a cross-sectional view of a capacitor showing a modification to the embodiment shown in FIG. 4.

FIG. 5 is different from the embodiment of FIG. 4 in that a recessed thermally-stable material layer pattern is positioned between the first and second cylindrical conductive layer patterns.

Referring to FIG. 5, a groove is formed by interposing a recessed thermally-stable material layer pattern 31a between the first cylindrical conductive layer pattern 29a and the second cylindrical conductive layer pattern 33a. Here, the inside of the groove must be completely filled with the high dielectric layer 37. As a result, it is possible to increase the thickness T3 of the high dielectric layer being formed on the recessed thermally-stable material layer pattern 31a compared with the thickness of the high dielectric layer formed on the storage electrode.

The above-mentioned modification is very effective in improving the leakage current characteristic of the capacitor when the work function of the recessed thermally-stable material layer pattern 31a' is lower than the work functions of the first and second cylindrical conductive layer patterns 29a and 33a. An improvement is noted when the recessed thermally-stable material layer pattern 31a' is formed of a conductive layer which thermally reacts to the high dielectric layer 37.

Figure 6:
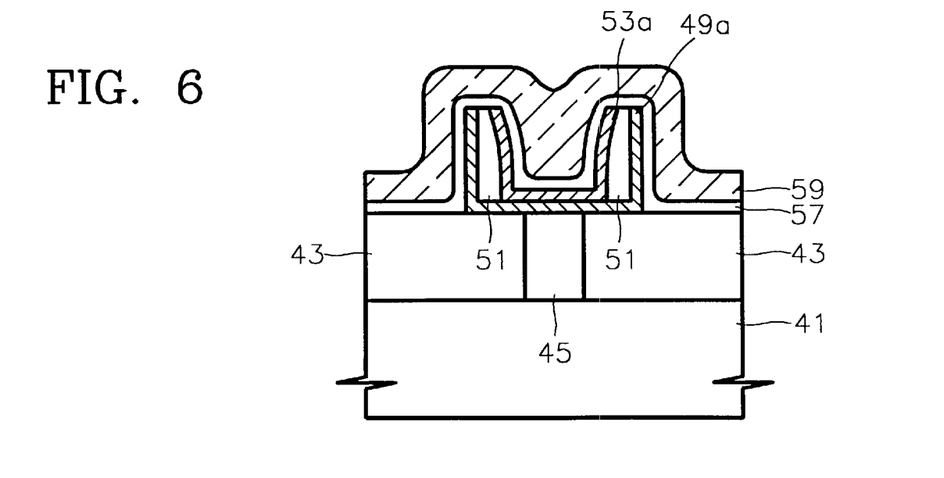
FIG. 6 is a cross-sectional view of a capacitor in accordance with another embodiment of the present invention.

Referring to FIG. 6, two cylindrical conductive layer patterns, which overlap each other, includes a first cylindrical conductive layer pattern 49a and a second cylindrical conductive layer pattern 53a, both of which are positioned on a semiconductor substrate 41. A spacer 51, formed from a thermally-stable material layer, is positioned only between the pillars of the first and second cylindrical conductive layer patterns 49a and 53a. The horizontal bottom of the first cylindrical conductive layer pattern 49a contacts the horizontal bottom of the second cylindrical conductive layer pattern 53a. The first cylindrical conductive layer pattern 49a corresponds to an outer cylinder which surrounds the second cylindrical conductive layer pattern 53a. The first and second cylindrical conductive layer patterns 49a and 53a form a storage electrode and are formed from the same material layer as the material layer of the embodiment of FIG. 4. A contact plug 45 is formed from a conductive layer such as a tungsten (W) layer and is positioned between the horizontal bottom of the first cylindrical conductive layer pattern 49a and the semiconductor substrate 41. Also, the contact plug 45 is surrounded by an interlayer dielectric film pattern 43.

A high dielectric layer 57 and a plate electrode 59 are sequentially stacked on the storage electrode. The high dielectric layer 57 and the plate electrode 59 are formed from the same material layer as the high dielectric layer 37 and the plate electrode 39 described in FIG. 4. The spacer 51 can be formed from a thermally-stable conductive layer or a thermally-stable insulating layer and is positioned between the pillars of the conductive layer patterns 49a and 53a. The thermally-stable conductive layer is formed of the same material as the material layer mentioned in FIG. 4. The thermally-stable insulating layer is preferably formed from either a dielectric layer such as a $SiO_2$, SiON, $Si_3N_4$, $Al_2O_3$, or $Ta_2O_5$ layer, or a dielectric layer having a perovskite structure such as a BST layer, a PZT layer, or a PLZT layer.

As mentioned above, according to another embodiment of the present invention, it is possible to prevent the storage electrode from being transformed or damaged during a subsequent thermal treatment process since a spacer formed from a thermally-stable material layer is positioned between the pillar of the inner cylinder and the pillar of the outer cylinder.

Figure 7:
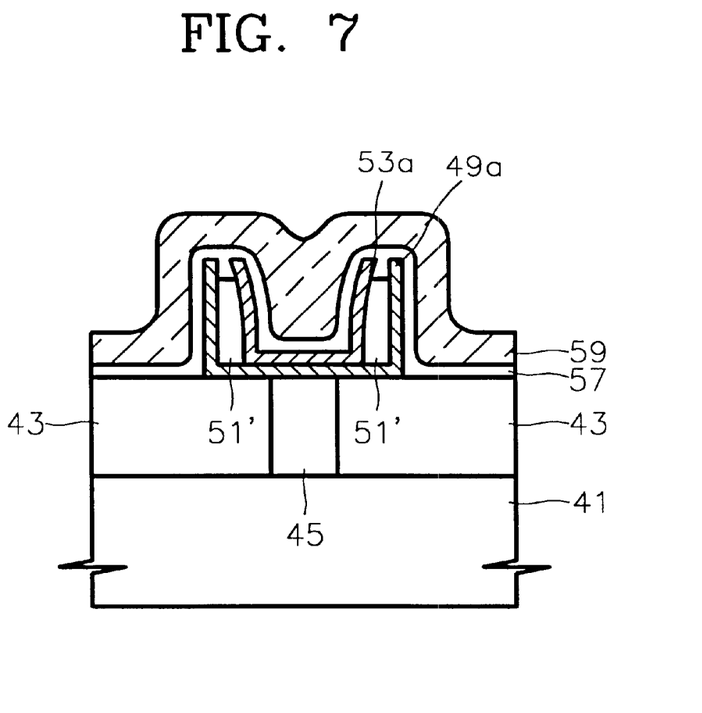
FIG. 7 is a cross-sectional view of a capacitor showing a modification to the embodiment shown in FIG. 6.

Referring to FIG. 7, a recessed spacer 51' is positioned between the pillar of the first cylindrical conductive layer pattern 49a and the pillar of the second cylindrical conductive layer pattern 53a. A groove is formed between the pillar of the first cylindrical conductive layer pattern 49a and the pillar of the second cylindrical conductive layer pattern 53a. Here, the inside of the groove must be completely filled with the high dielectric layer 57 as described in FIG. 5. As a result, it is possible to increase the thickness of the high dielectric layer formed on the recessed spacer 51' compared with the thickness of the high dielectric layer formed on the storage electrode. Accordingly, according to the above modification, it is possible to obtain the same effect as that of the modification shown in FIG. 5.

Figure 8:
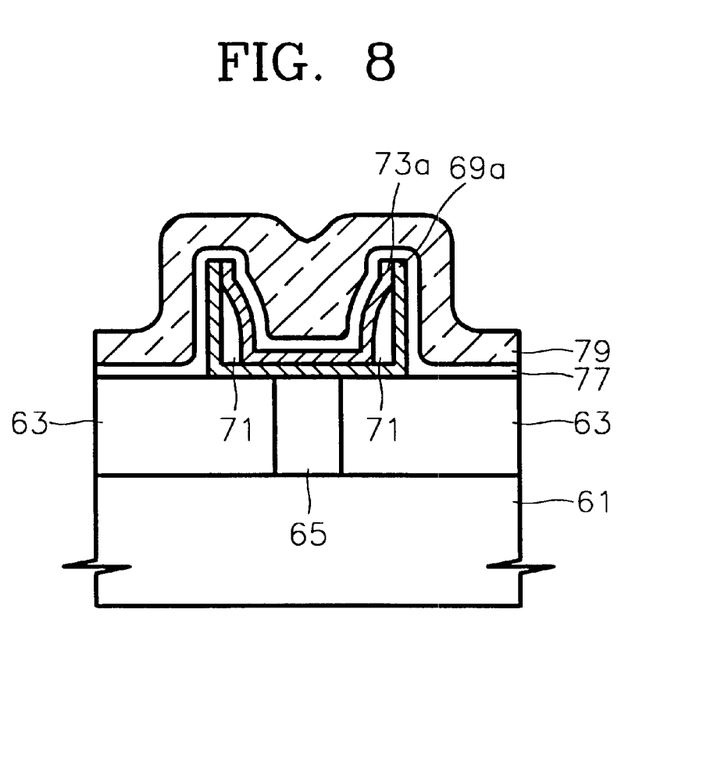
FIG. 8 is a cross-sectional view of a capacitor in accordance with still another embodiment of the present invention.

FIG. 8 is a sectional view for showing still another embodiment of the present invention. However, this embodiment of the present invention is different from the embodiment of FIG. 6 in that the upper portion of the pillar of the first cylindrical conductive layer pattern contacts the upper portion of the pillar of the second cylindrical conductive layer pattern.

Referring to FIG. 8, two cylindrical conductive layer patterns, a first cylindrical conductive layer pattern 69a and a second cylindrical conductive layer pattern 73a, overlap each other and are positioned on a semiconductor substrate 61. A spacer 71, formed from a thermally-stable material layer, for example, a thermally-stable conductive layer or a thermally-stable insulating layer, is positioned only between the pillars of the first and second cylindrical conductive layer patterns 69a and 73a. In the present embodiment, the upper portion of the pillar of the first cylindrical conductive layer pattern 69a is in contact with the upper portion of the pillar of the second cylindrical conductive layer pattern 73a. Accordingly, the spacer 71 is completely surrounded by the first cylindrical conductive layer pattern 69a and the second cylindrical conductive layer pattern 73a. The first and second cylindrical conductive layer patterns 69a and 73a form a storage electrode.

A high dielectric layer 77 and a plate electrode 79 are sequentially stacked on the storage electrode. A contact plug 65 formed from a conductive layer such as a tungsten (W) layer may be positioned between the horizontal bottom of the first cylindrical conductive layer pattern 69a and the semiconductor substrate 61. The side wall of the contact plug 65 is surrounded by an interlayer dielectric film pattern 63.

The first and second cylindrical conductive layer patterns 69a and 73a are formed from the same material layer as the first and second cylindrical conductive layer patterns 49a and 53a of FIG. 6. Also, the spacer 71, the high dielectric layer 77, and the plate electrode 79 are formed from the same material layers as the spacer 51, the high dielectric layer 57, and the plate electrode 59, respectively, of FIG. 6.

The method of manufacturing a capacitor according to the present invention will now be described with reference to a DRAM cell. FIGS. 9–12 are sectional views for describing a method for manufacturing a capacitor according to an embodiment of the present invention.

Figure 9:
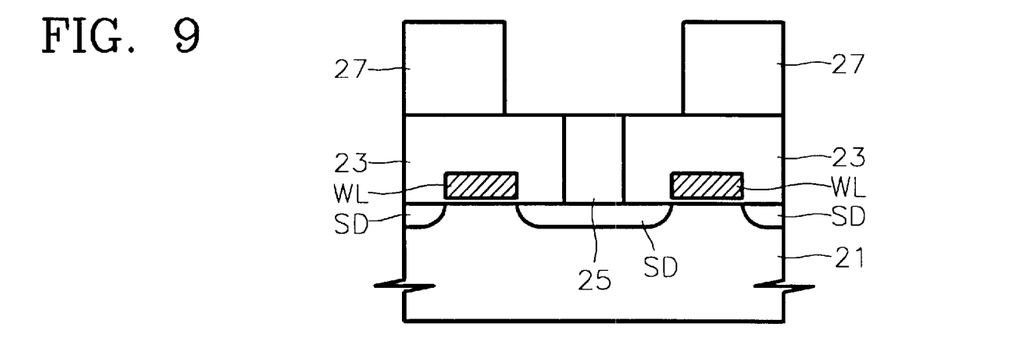
FIGS. 9–12 are cross-sectional views of a capacitor showing a method for manufacturing a capacitor according to an embodiment of the present invention.

Referring to FIG. 9, a plurality of wordlines (WL), insulated by a gate oxide layer, is formed on a semiconductor substrate 21. Source/drain regions (SD) are formed by implanting impurities into the semiconductor substrate 21 at both sides of each wordline (WL). Here, the wordline (WL) and the source/drain regions (SD), at both sides of the wordline (WL), form an access transistor for a cell. An interlayer dielectric film 23 is formed over the entire surface of the semiconductor substrate on which the access transistor is formed. The interlayer dielectric layer 23 is formed from an oxide film having an excellent flatness, for example, a BPSG layer grown at a high temperature of 800° C. through 950° C. or a CVD oxide layer planarized by the etch-back process or the CMP process.

An interlayer dielectric film pattern 23, including a storage node contact hole which exposes a source/drain region (SD) between wordlines (WL) and are adjacent to each other, is formed by patterning the interlayer dielectric film. A conductive layer which fills the storage node contact hole, for example, a tungsten (W) layer is formed over the entire surface of the semiconductor substrate in which the storage node contact hole is formed. A contact plug 25 is formed in the storage node contact hole by planarizing the conductive layer by either a CMP process or the blanket etch-back process until the upper surface of the interlayer dielectric film pattern 23 is exposed. A sacrificial insulating layer 27, such as a CVD oxide layer, is formed on the entire surface of the semiconductor substrate on which the contact plug 25 is formed. The sacrificial insulating layer 27 is patterned to form a sacrificial insulating layer pattern which includes a hole that exposes the contact plug 25.

Figure 10:
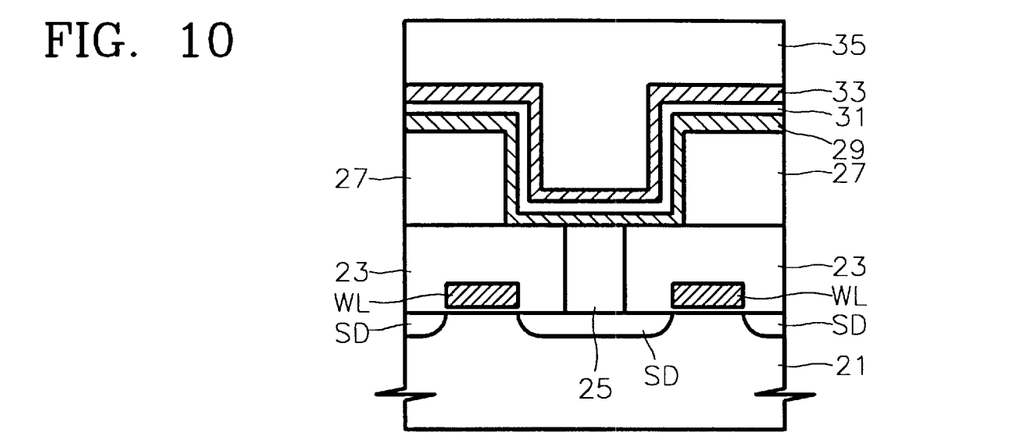

Referring to FIG. 10, a first conductive layer 29, a thermally-stable material layer 31, and a second conductive layer 33 are sequentially formed so that the thermally-stable material layer is positioned between the two conductive layers. The first and second conductive layers 29 and 33 are preferably formed from an oxidation-resistant metal layer such as either a platinum (Pt) layer, an iridium (Ir) layer, a ruthenium (Ru) layer, or an osmium (Os) layer, or a conductive metal oxide layer such as a $RuO_2$ layer or an $IrO_2$ layer. The oxidation-resistant metal layer or the conductive metal oxide layer is formed by a known process, such as a sputtering process. Also, the first and second conductive layers 29 and 33 can be formed of a PtO layer. The PtO is formed by a reactive sputtering process in which a platinum (Pt) target is used in an oxygen gas atmosphere. The thermally-stable material layer 31, for preventing the first and second conductive materials 29 and 33 from being transformed or broken, is preferably formed from a material layer having conductivity. This is because the first and second conductive layers 29 and 33 must be electrically connected to each other.

The thermally-stable conductive layer 31 is preferably formed from either a refractory metal layer, binary refractory metal nitride layer, a ternary refractory metal nitride layer, a refractory metal suicide layer, a conductive carbide layer, or a conductive boride layer. To be more specific, the refractory metal layer is preferably a tungsten (W) layer, a titanium (Ti) layer or a tantalum (Ta) layer. The binary refractory metal nitride layer is preferably a TiN layer, a TaN layer, or a WN layer. The ternary refractory metal nitride layer is preferably a WSiN layer, a TiAlN layer, a TiSiN layer, or a TaSiN layer. The refractory metal silicide layer is preferably a $TiSi_2$ layer, a $TaSi_2$ layer, or a $WSi_2$ layer. Also, the conductive carbide layer is preferably a TaC layer, a TiC layer, or a WC layer. The conductive boride layer is preferably a $TiB_2$ layer. A material layer for planarization 35 fills the inside of the hole, for example, a CVD oxide layer or a photoresist layer is formed on the second conductive layer 33.

Figure 11:
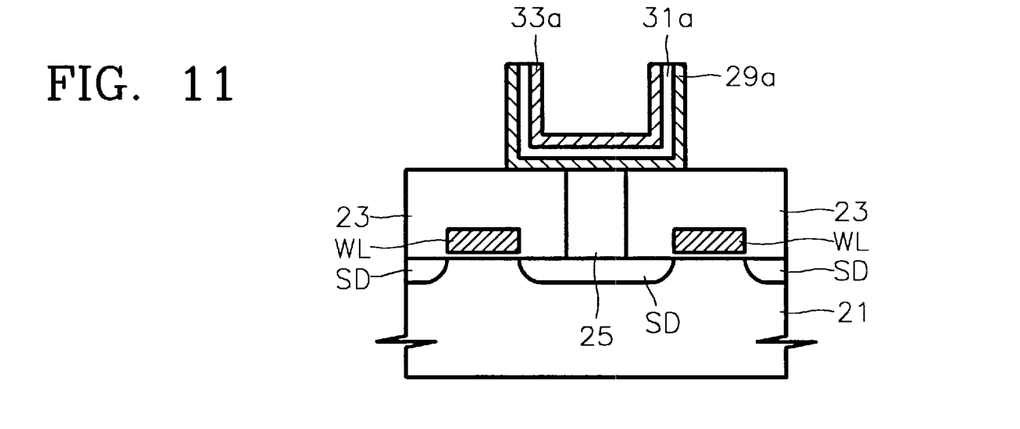

Referring to FIG. 11, the material layer for planarization 35, the second A conductive layer 33, and the thermally-stable material layer 31, and the first conductive layer 29 are etched using the blanket etch-back process or the CMP process until the upper surface of the sacrificial insulating layer pattern 27 is exposed. When the first and second conductive layers 29 and 33 are formed of a platinum (Pt) layer, the first and second conductive layers 29 and 33 are preferably blanket etched back by a sputtering etching process using an argon (Ar) or chlorine (Cl) gas. As mentioned above, the material layer for planarization 35, the second conductive layer 33, the thermally-stable material layer 31, and the first conductive layer 29 are etched by the blanket etch-back process or the CMP process. As a result, a first cylindrical conductive layer pattern 29a and a second cylindrical conductive layer pattern 33a are formed inside the hole, and a thermally-stable material layer pattern 31a, namely, a thermally-stable conductive layer pattern is positioned between the first and second cylindrical conductive layer patterns 29a and 33a.

The surface of the storage electrode, formed from the first and second cylindrical conductive layer patterns 29a and 33a, is exposed by removing the material layer for planarization 35 residing inside the second cylindrical conductive layer pattern 33a and the sacrificial insulating layer pattern 27 using an etching process such as a wet etching process. When the material layer for planarization 35 is formed from a photoresist layer, the material layer for planarization 35 which resides inside the second cylindrical conductive layer pattern 33a is removed by a widely known process such as an ashing process using an oxygen gas.

Figure 12:
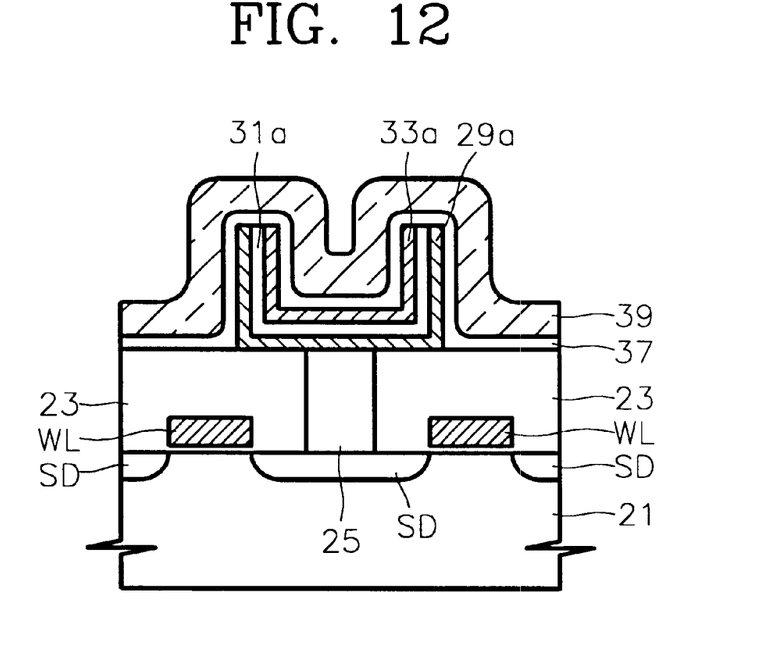

Referring to FIG. 12, a high dielectric layer 37 and a plate electrode 39 are sequentially formed over the entire surface of the semiconductor substrate through which the storage electrode is exposed. The high dielectric layer 37 is preferably formed of a dielectric layer such as either a $Ta_2O_5$ layer or an $Al_2O_3$ layer, or a dielectric layer having a perovskite structure such as either a BST layer, a PZT layer or a PLZT layer. The high dielectric layer 37 shows a high dielectric constant when the high dielectric layer is deposited by a CVD method at a temperature of between about 400° C. to 500° C. and thermally treated at a temperature of between about 550° C. to 750° C. The storage electrode formed from the first and second cylindrical conductive layer patterns 29a and 33a maintains a stable form during the thermal treatment process by the thermally-stable material layer pattern 31a. The plate electrode 39 is preferably formed from the same material layer as the first and second conductive layers 29 and 33 as described in FIG. 10.

According to an embodiment of the present invention, it is possible to prevent the storage electrode from being transformed or broken during a subsequent thermal treatment, by interposing a thermally-stable material layer between the first and second cylindrical conductive layer patterns 29a and 33a.

Figure 13:
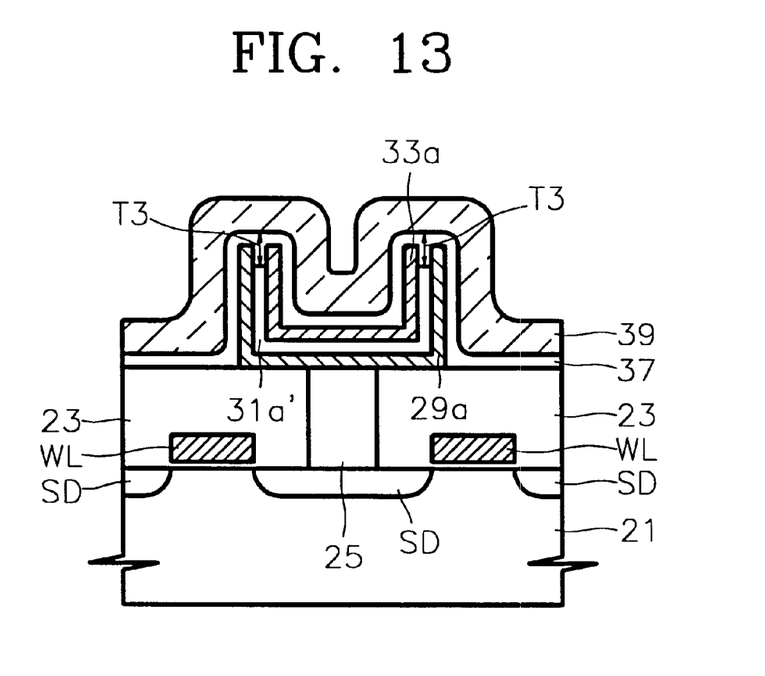
FIG. 13 is a cross-sectional view of a capacitor showing a modification to the embodiment shown in FIGS. 9 through 12.

Referring to FIG. 13, the thermally-stable material layer pattern 31 a is selectively recessed by an etching process, for example, a wet etching process. When the thermally-stable material layer pattern 31 a, namely, the thermally-stable conductive layer pattern is formed from the TiN layer and the first and second cylindrical conductive layer patterns 29a and 33a are formed from a platinum (Pt) layer, the thermally-stable conductive layer pattern can be selectively recessed by using a solution obtained by mixing hydrogen peroxide ($H_2O_2$) with hydrofluoric acid (HF). When the thermally-stable material layer pattern 31 a is recessed, a groove is formed between the first and second cylindrical conductive layer patterns 29a and 33a. A high dielectric layer 37 and a plate electrode 39 are formed on the entire surface of the semiconductor substrate on which the recessed thermally-stable material layer pattern 31a is formed, by the same method as the method described in FIG. 12. The groove must be completely filled with the high dielectric layer 37. Accordingly, it is possible to make the thickness T3 of the high dielectric layer 37 formed on a thermally-stable material layer pattern 31a' larger than the thickness of the high dielectric layer 37 being formed on the storage electrode.

According to the above modification, it is possible to improve the leakage current characteristic of the capacitor when the recessed thermally-stable conductive layer pattern 31a' is between the first and second cylindrical conductive layer patterns 29a and 33a, and has a work function lower than the work function of the storage electrode or is formed of a material layer which thermally reacts to the high dielectric layer 37.

FIGS. 14–17 are cross-sectional views showing a method of manufacturing a capacitor according to another embodiment of the present invention.

Figure 14:
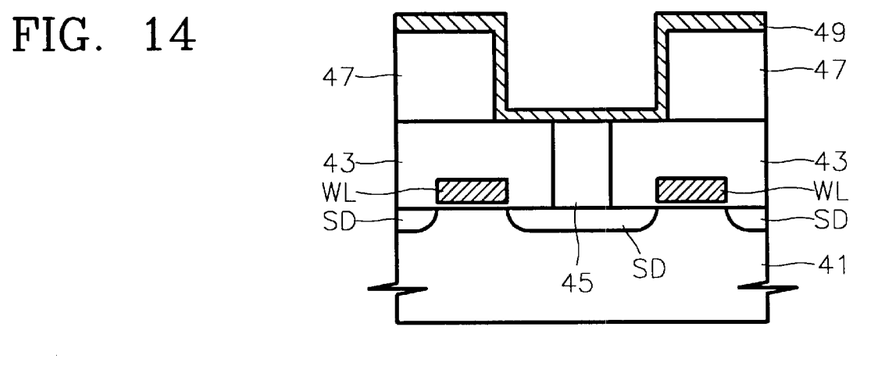
FIGS. 14–17 are cross-sectional views showing a method for manufacturing a capacitor in accordance with another embodiment of the present invention.

Referring to FIG. 14, a wordline (WL), a source/drain region (SD), an interlayer dielectric layer 43, a contact plug 45, and a sacrificial insulating layer pattern 47 are formed on a semiconductor substrate 41 by the same method as the method described in connection with the embodiment described in reference to FIG. 9. A first conductive layer 49, which follows the surface structure of a hole which exposes the contact plug 45, is formed on the entire surface of the semiconductor substrate on which the sacrificial insulating layer pattern 47 is formed. The first conductive layer 49 is formed of the same material layer as the first conductive layer 29 of FIG. 10.

Figure 15:
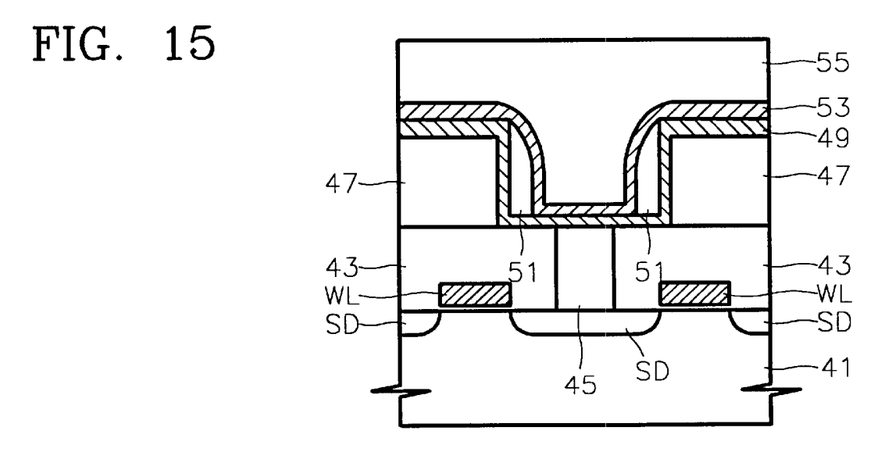

Referring to FIG. 15, a thermally-stable material layer is formed on the entire surface of the semiconductor substrate on which the first conductive layer 49 is formed. A spacer 51 is formed on the side wall of the first conductive layer 49 by anisotropically etching the thermally-stable material layer. At this time, the first conductive layer 49 on the bottom of the hole is exposed. When the thermally-stable material layer is formed from a TiN layer, the anisotropic etching process is performed by a chlorine-based dry etching process. A second conductive layer 53, formed from the same material layer as the first conductive layer 49, is formed on the entire surface of the semiconductor substrate on which the spacer 51 is formed. A material layer for planarization 55 for filling the inside of the hole is formed on the entire surface of the semiconductor substrate on which the second conductive layer 53 is formed, by the same method as an embodiment of the present invention described in FIG. 10.

Figure 16:
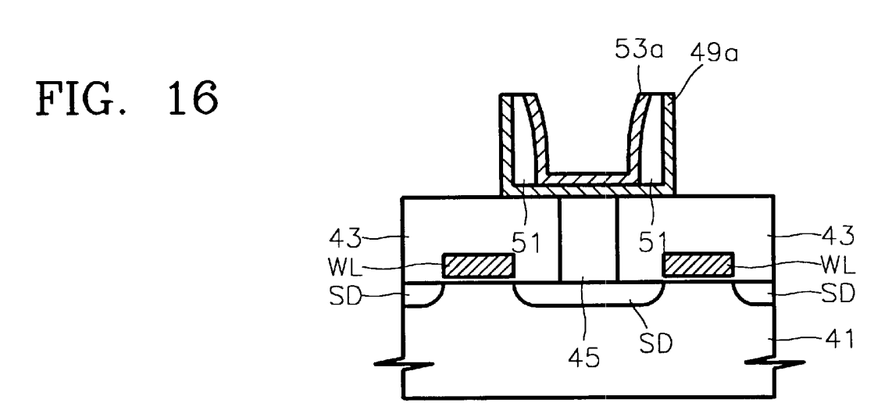

Referring to FIG. 16, a first cylindrical conductive layer pattern 49a and a second cylindrical conductive layer pattern 53a are formed inside the hole by etching the material layer for planarization 55, the second conductive layer 53, and the first conductive layer 49 using a blanket etch-back process or a CMP process, until the upper surface of the sacrificial insulating layer pattern 47 is exposed. The spacer 51 formed from the thermally-stable material layer is exposed between the pillars of the first and second cylindrical conductive layer patterns 49a and 53a. Also, the horizontal bottom of the first cylindrical conductive layer pattern 49a contacts the horizontal bottom of the second cylindrical conductive layer pattern 53a. Therefore, the spacer 51 may be formed from any of the thermally-stable conductive layers and the thermally-stable insulating layers. The thermally-stable conductive layer is the same as the material layers mentioned in connection with the embodiment described in reference to FIG. 10. The thermally-stable insulating layer is formed from either a dielectric layer such as a $SiO_2$ layer, a SiON layer, a $Si_3N_4$ layer, an $Al_2O_3$ layer, or a $Ta_2O_5$ layer, or a dielectric layer having a perovskite structure such as a BST layer, a PZT layer, or a PLZT layer. The first and second cylindrical conductive layer patterns 49a and 53a form a storage electrode.

Figure 17:
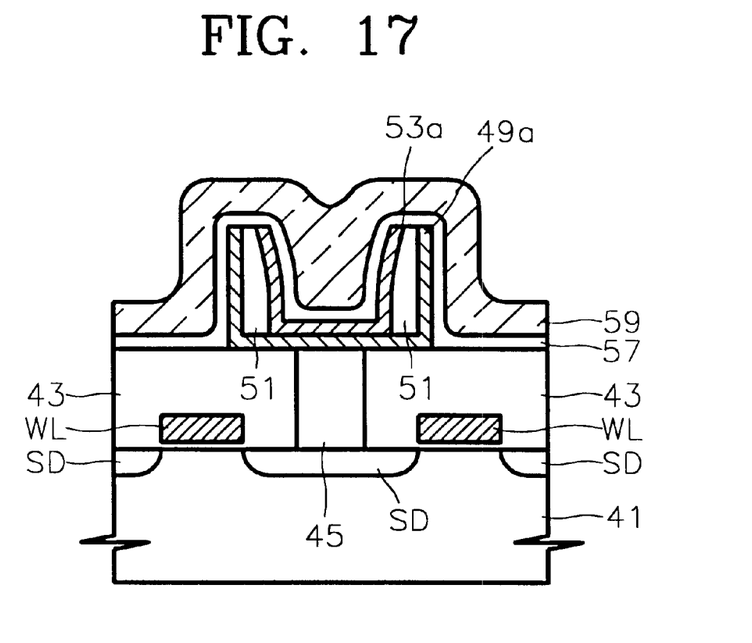

Referring to FIG. 17, a high dielectric layer 57 and a plate electrode 59 are sequentially formed on the entire surface of the semiconductor substrate through which the storage electrode was exposed. The high dielectric layer 57 and the plate electrode 59 are formed by the same method as an embodiment of the present invention described in FIG. 12.

According to another embodiment of the present invention, the spacer 51 formed from the thermally-stable material layer is positioned between the pillars of first and second cylindrical conductive layer patterns 49a and 53a. Therefore, it is possible to prevent the storage electrode from being transformed or broken during a subsequent thermal treatment. Also, since the horizontal bottom of the first cylindrical conductive layer pattern 49a is in contact with the horizontal bottom of the second cylindrical conductive layer pattern 53a, the spacer 51 can be formed from a thermally-stable insulating layer or a thermally-stable conductive layer.

Figure 18:
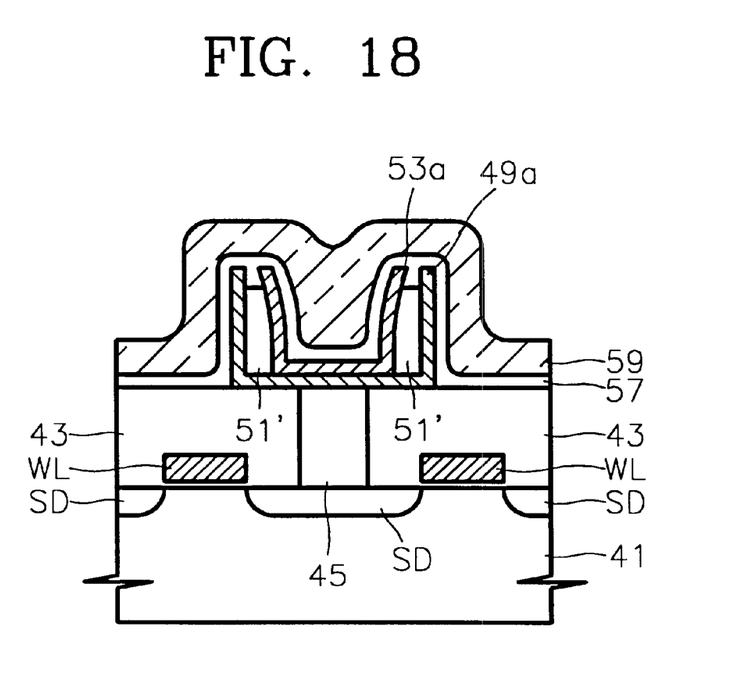
FIG. 18 is a cross-sectional view of a capacitor showing a modification to the embodiment shown in FIGS. 14 through 17.

FIG. 18 is a sectional view for describing a modification of another embodiment of the present invention described in FIGS. 14 through 17. The first and second cylindrical conductive layer patterns 49a and 53a and the spacer 51 are formed using the method as described in reference to FIGS. 14 through 16.

Referring to FIG. 18, the spacer 51 of FIG. 16 is selectively recessed using an etching process, for example, a wet etching process. Accordingly, a groove is formed between the pillars of the first and second cylindrical conductive layer patterns 29a and 33a. The high dielectric layer 57 and the plate electrode 59 are formed over the entire surface of the semiconductor substrate on which the recessed spacer 51' is formed by the same method as the method described in reference to FIG. 17. As mentioned with reference to FIG. 13, the groove must be completely filled with the high dielectric layer 57. Accordingly, it is possible to make the thickness of the high dielectric layer 57 formed on the recessed spacer 51' larger than the thickness of the high dielectric layer 57 formed on the pillars of the first and second cylindrical conductive patterns 49a and 53a. According to the above modification, when the spacer 51 is formed from the thermally-stable conductive layer, it is possible to improve the leakage current characteristic of the capacitor.

FIGS. 19–22 are cross-sectional views showing a method of manufacturing a capacitor according to still another embodiment of the present invention.

Figure 19:
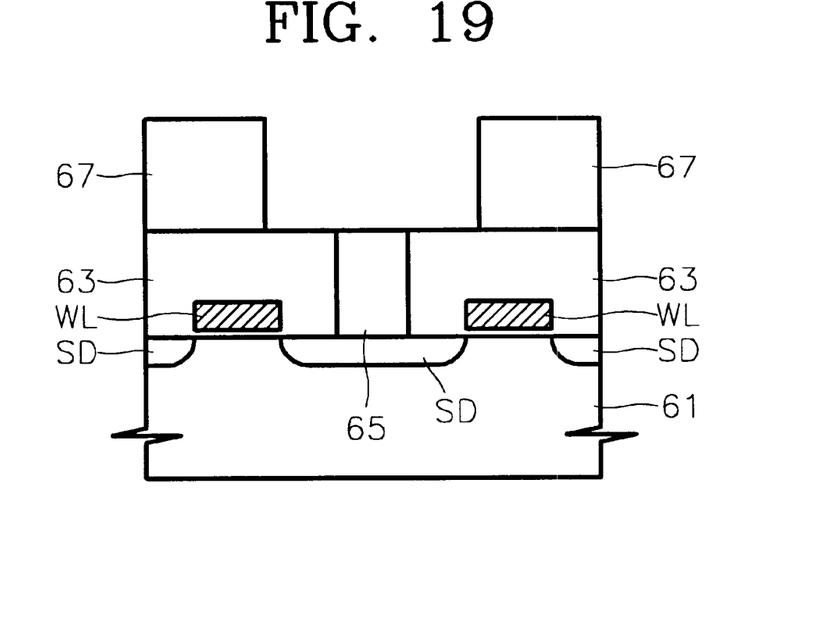
FIGS. 19–22 are cross-sectional views of a capacitor showing a method for manufacturing a capacitor according to still another embodiment of the present invention.

Referring to FIG. 19, a wordline (WL), a source/drain region (SD), an interlayer dielectric layer 63, a contact plug 65, and a sacrificial insulating layer pattern 67 are formed on a predetermined region of a semiconductor substrate 61 by the method as described in reference to FIG. 9.

Figure 20:
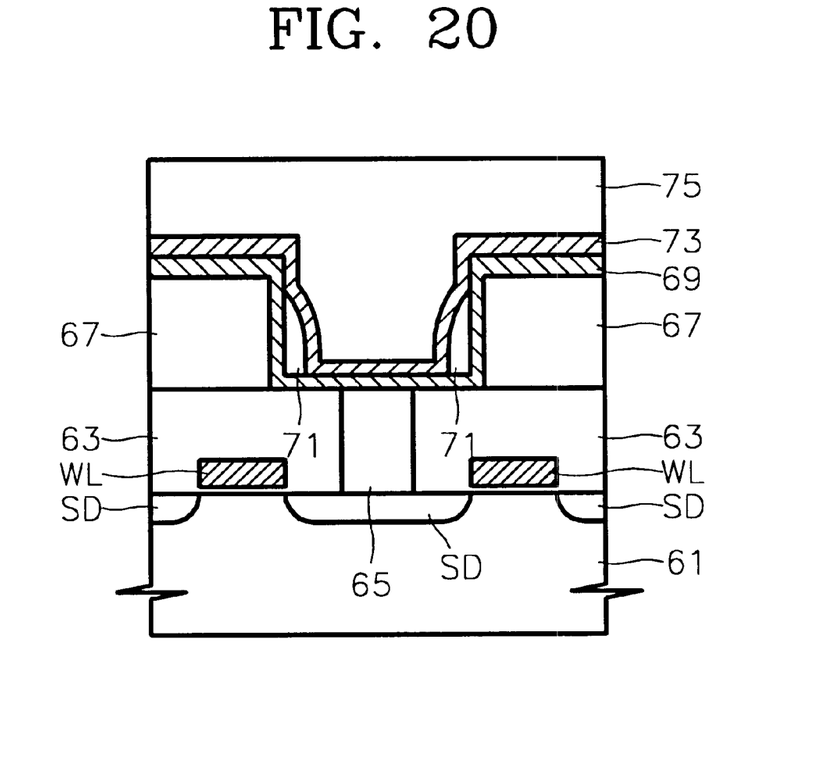

Referring to FIG. 20, a first conductive layer 69 is formed over the entire surface of the semiconductor substrate on which the sacrificial insulating layer pattern 67 is formed. The first conductive layer 69 is formed from the same material layer as the first conductive layer 29 of FIG. 10. A thermally-stable material layer, for example, a thermally-stable conductive layer or a thermally-stable insulating layer, which follows the surface structure of the first conductive layer 69 is formed over the entire surface of the semiconductor substrate on which the first conductive layer 69 is formed. A spacer 71 is formed on the side wall of the first conductive layer 69 along the side wall of the hole by anisotropically etching the thermally-stable material layer. The upper side wall of the first conductive layer 69 is exposed by excessively anisotropically etching the thermally-stable material layer. A second conductive layer 73 is formed over the entire surface of the semiconductor substrate on which the spacer 71 is formed. The second conductive layer 73 is preferably formed from the same material layer as the first conductive layer 69. A material layer for planarization 75, for example, a CVD oxide layer or a photoresist layer, which fills the inside of the hole, is formed over the entire surface of the semiconductor substrate on which the second conductive layer 73 is formed.

Figure 21:
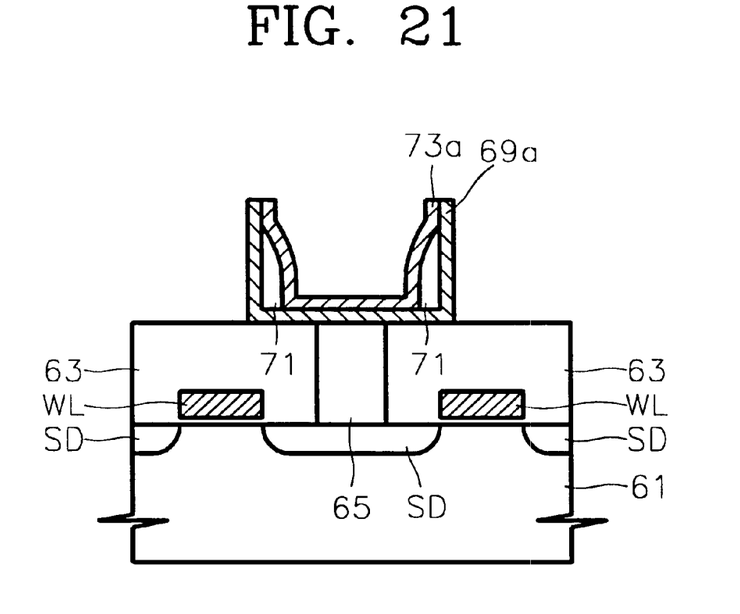

Referring to FIG. 21, a first cylindrical conductive layer pattern 69a and a second cylindrical conductive layer pattern 73a are formed inside the hole using the same method as the method described in reference to FIG. 16. When the first and second cylindrical conductive layer patterns 69a and 73a are formed, the upper portion of the pillar of the first cylindrical conductive layer pattern 69a makes contact with the upper portion of the pillar of the second cylindrical conductive layer pattern 73a. The first and second cylindrical conductive layer patterns 69a and 73a form a storage electrode. The surface of the storage electrode is exposed by removing the material layer for planarization 75 which resides inside the second cylindrical conductive layer pattern 73a and the sacrificial insulating layer pattern 67.

Figure 22:
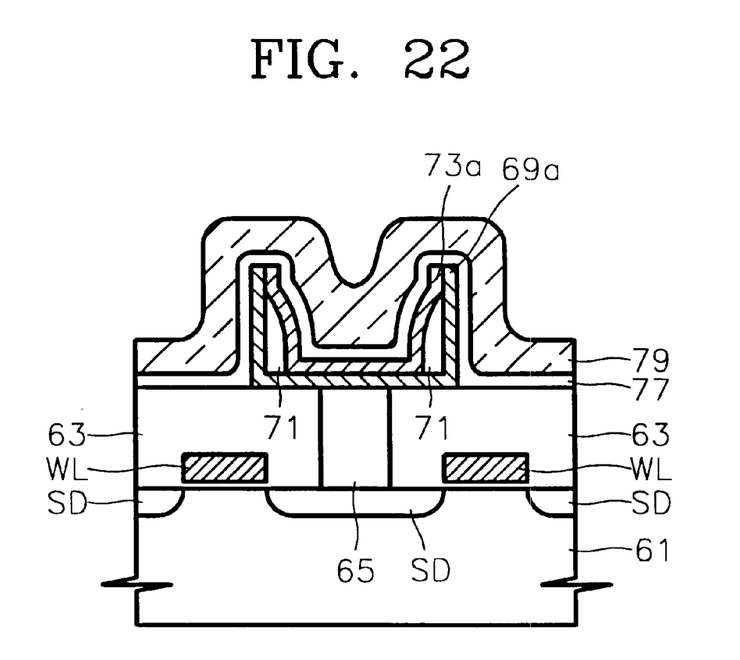

Referring to FIG. 22, a high dielectric layer 77 and a plate electrode 79 are formed over the entire surface of the semiconductor substrate through which the storage electrode is exposed, by the same method as the method described in reference to FIG. 17.

According to the embodiments of the present invention, the thermally stable material layer pattern, or the spacer formed of the thermally-stable material layer, is positioned between at least two cylindrical conductive layer patterns which form the storage electrode. Therefore, it is possible to prevent the storage electrode formed from ultra-thin conductive layer patterns from being transformed or broken during a subsequent thermal treatment process for forming the high dielectric layer. As a result, it is possible to realize a high performance capacitor which has high reliability and excellent leakage current characteristics.

The present invention is not restricted to the capacitor having the cylindrical storage electrode, but can be applied to every capacitor having a storage electrode in the form of a vertical pillar.

It will be apparent to one of ordinary skill in the art that modifications of the described embodiments may be made without departing from the spirit and scope of the invention.

What is claimed is:

1. A capacitor of a semiconductor device comprising:
   a storage electrode having at least two conductive layer patterns which overlap each other on a semiconductor substrate, each of the conductive layer patterns having a horizontal bottom and a pillar which protrudes upward from the horizontal bottom at a predetermined location;
   a thermally-stable material layer pattern positioned between the conductive layer patterns, and is formed from a thermally-stable conductive layer, wherein an upper portion of the thermally-stable conductive layer positioned between the pillars of the conductive layer patterns is recessed; and
   a high dielectric layer and a plate electrode which are sequentially formed on the storage electrode.

2. The capacitor of claim 1, wherein each of the conductive layer patterns is formed of an oxidation-resistant metal layer or a conductive metal oxide layer.

3. The capacitor of claim 1, wherein each of the conductive layer patterns is cylindrically shaped.

4. The capacitor of claim 1, wherein the thermally-stable conductive layer is a refractory metal layer, a binary refractory metal nitride layer, a ternary refractory metal nitride layer, a refractory metal silicide layer, a conductive carbide layer, or a conductive boride layer.

5. The capacitor of claim 1, wherein the high dielectric layer is an $Al_2O_3$ layer, a $Ta_2O_5$ layer, a BST layer ($(Ba,Sr)TiO_3$), a PZT layer ($(Pb,Zr)TiO_3$), or a PLZT layer ($(Pb,La,Zr)TiO_3$).

6. The capacitor of claim 1, further comprising a contact plug being positioned between the storage electrode and the semiconductor substrate.

7. A capacitor of a semiconductor device comprising:
   a storage electrode having at least two conductive layer patterns which overlap each other on a semiconductor substrate, each of the conductive layer patterns having a horizontal bottom and a pillar which protrudes upward from the horizontal bottom at a predetermined location;
   a thermally-stable material layer pattern positioned only between the pillars of the conductive layer patterns, and the horizontal bottoms of the conductive layer patterns are in contact with each other; and a high dielectric layer and a plate electrode which are sequentially formed on the storage electrode.

8. The capacitor of claim 7, wherein the thermally-stable material layer pattern is formed from a thermally-stable conductive layer or a thermally-stable insulating layer.

9. The capacitor of claim 7, wherein an upper portion of the thermally-stable conductive layer is recessed.

10. The capacitor of claim 7, wherein the thermally-stable insulating layer is a $SiO_2$ layer, a $Si_3N_4$ layer, an $Al_2O_3$ layer, a $Ta_2O_5$ layer, a BST layer ($(Ba,Sr)TiO_3$), a PZT layer ($(Pb,Zr)TiO_3$), or a PLZT layer ($(Pb,La,Zr)TiO_3$).

11. The capacitor of claim 7, wherein the upper portions of the pillars of the conductive layer patterns are in contact with each other and the thermally-stable material layer pattern is completely surrounded by the conductive layer patterns.

* * * * *